(12) United States Patent
Hsiao et al.

(10) Patent No.: US 12,082,405 B2
(45) Date of Patent: Sep. 3, 2024

(54) PROGRAMMABLE MEMORY AND FORMING METHOD THEREOF

(71) Applicant: UNITED MICROELECTRONICS CORP., Hsin-Chu (TW)

(72) Inventors: Hsueh-Chun Hsiao, Hsinchu County (TW); Yi-Ning Peng, Miaoli County (TW); Tzu-Yun Chang, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/203,054

(22) Filed: May 29, 2023

(65) Prior Publication Data

US 2023/0301083 A1    Sep. 21, 2023

Related U.S. Application Data

(63) Continuation of application No. 17/381,219, filed on Jul. 21, 2021, now Pat. No. 11,706,915.

(30) Foreign Application Priority Data

Jun. 21, 2021   (TW) ................................ 110122630

(51) Int. Cl.
| | | |
|---|---|---|
| *H10B 41/30* | (2023.01) | |
| *H01L 21/28* | (2006.01) | |
| *H01L 29/423* | (2006.01) | |
| *H01L 29/66* | (2006.01) | |
| *H01L 29/78* | (2006.01) | |
| *H01L 29/788* | (2006.01) | |

(52) U.S. Cl.
CPC ........ *H10B 41/30* (2023.02); *H01L 29/40114* (2019.08); *H01L 29/42328* (2013.01); *H01L 29/66492* (2013.01); *H01L 29/66545* (2013.01); *H01L 29/66825* (2013.01); *H01L 29/7833* (2013.01); *H01L 29/7881* (2013.01)

(58) Field of Classification Search
CPC .............. H10B 41/30; H01L 29/40114; H01L 29/42328; H01L 29/66492; H01L 29/66545; H01L 29/66825; H01L 29/7833; H01L 29/7881
See application file for complete search history.

(56) References Cited

U.S. PATENT DOCUMENTS

| | | | |
|---|---|---|---|
| 6,133,098 A | * | 10/2000 | Ogura ................ G11C 16/0458 257/E27.103 |
| 8,785,307 B2 | | 7/2014 | Liu |
| 10,163,641 B2 | | 12/2018 | Lee |
| 2017/0103991 A1 | | 4/2017 | Kim |

* cited by examiner

*Primary Examiner* — David Vu
(74) *Attorney, Agent, or Firm* — Winston Hsu

(57) ABSTRACT

An array of programmable memory includes a first floating gate and a second floating gate disposed on a substrate along a first direction, two spacers disposed between and parallel to the first floating gate and the second floating gate, a first word line sandwiched by one of the spacers and the adjacent first floating gate, and a second word line sandwiched by the other one of the spacers and the adjacent second floating gate, and two first spacers disposed on the substrate, wherein one of the first spacer is disposed between the first word line and the first floating gate, and another spacer is disposed between the second word line and the second floating gate, wherein each spacer has substantially the same shape as each first spacer.

14 Claims, 4 Drawing Sheets

PROGRAMMABLE MEMORY AND FORMING METHOD THEREOF

CROSS REFERENCE TO RELATED APPLICATIONS

This application is a continuation application of U.S. application Ser. No. 17/381,219, filed on Jul. 21, 2021. The content of the application is incorporated herein by reference.

BACKGROUND OF THE INVENTION

1. Field of the Invention

The present invention relates generally to an array of memory cells and forming method thereof, and more specifically to an array of electrically erasable programmable read only memory (EEPROM) cells and forming method thereof.

2. Description of the Prior Art

Memory devices include volatile memory devices and nonvolatile memory devices. Volatile memory devices can be classified into Dynamic Random Access Memory (DRAM) and Static Random Access Memory (SRAM). Nonvolatile memory devices may include Electrically Erasable Programmable Read Only Memory (EEPROM) devices, Ferroelectric Random Access Memory (FeRAM) devices, Phase-change Random Access Memory (PRAM) devices, Magnetic Random Access Memory (MRAM) devices and Flash Memory devices.

SUMMARY OF THE INVENTION

The present invention provides an array of electrically erasable programmable read only memory (EEPROM) and forming method thereof, which forms word lines between spacers by self-aligning, to avoid the non-uniformity of the widths of the word lines caused by the shiftings while patterning.

The present invention provides an array of electrically erasable programmable read only memory (EEPROM) including a first row of floating gate, a second row of floating gate, two spacers, a first row of word line and a second row of word line. The first row of floating gate and the second row of floating gate are disposed on a substrate along a first direction. The spacers are disposed between and parallel to the first row of floating gate and the second row of floating gate. The first row of word line is sandwiched by one of the spacers and the adjacent first row of floating gate, and the second row of word line is sandwiched by the other one of the spacers and the adjacent second row of floating gate.

The present invention provides an array of electrically erasable programmable read only memory (EEPROM) including a first floating gate, a second floating gate, two spacers, a first word line and a second word line. The first floating gate and the second floating gate are disposed on a substrate. The spacers are disposed between the first floating gate and the second floating gate. The first word line is sandwiched by one of the spacers and the adjacent first floating gate, and the second word line is sandwiched by the other one of the spacers and the adjacent second floating gate.

The present invention provides a method of forming an array of electrically erasable programmable read only memory (EEPROM) including the following steps. A first floating gate, a dummy floating gate and a second floating gate are formed on a substrate. Spacers are formed on sidewalls of the dummy floating gate, and first spacers are formed on sidewalls of the first floating gate and the second floating gate. An electrode layer fills in space between the first floating gate, the dummy floating gate and the second floating gate. The dummy floating gate is removed.

According to the above, the present invention provides an array of electrically erasable programmable read only memory (EEPROM) and forming method thereof, which forms a first floating gate, a dummy floating gate and a second floating gate on a substrate; forms spacers on sidewalls of the dummy floating gate, and forms first spacers on sidewalls of the first floating gate and the second floating gate; fills an electrode layer in space between the first floating gate, the dummy floating gate and the second floating gate. By doing this, a part of the electrode layer between one of the spacers and the adjacent first floating gate serves as a first word line, and a part of the electrode layer between the other one of the spacers and the adjacent second floating gate serves as a second word line. By forming word lines between spacers by self-aligning, the non-uniformity of the widths of the word lines caused by the shiftings while patterning can be avoided.

These and other objectives of the present invention will no doubt become obvious to those of ordinary skill in the art after reading the following detailed description of the preferred embodiment that is illustrated in the various figures and drawings.

DETAILED DESCRIPTION

The present invention provides an array of electrically erasable programmable read only memory (EEPROM) with spacers, to form self-aligned word lines and avoid the shiftings of the word lines.

Figure 1:
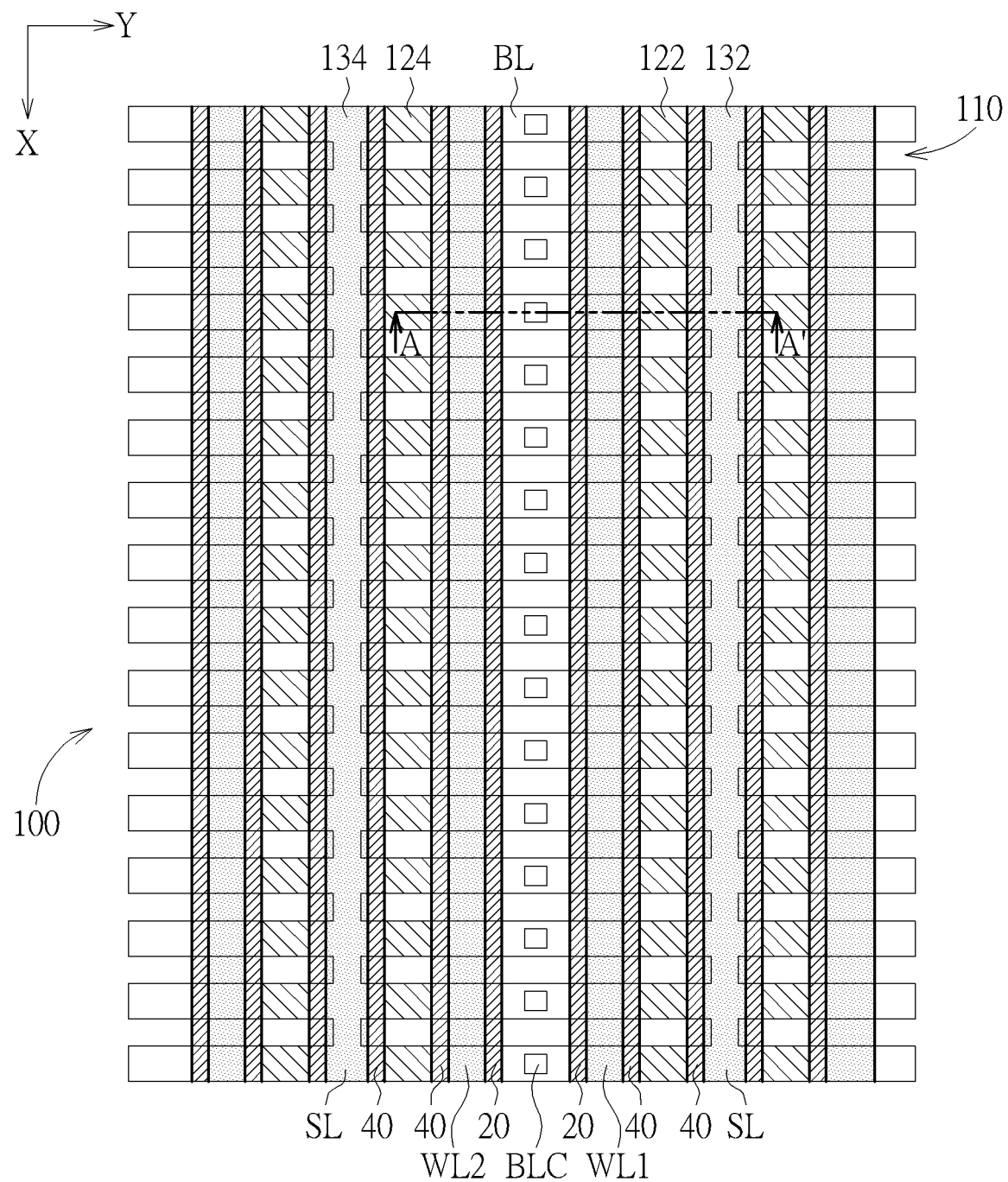
FIG. 1 schematically depicts a top view of an array of electrically erasable programmable read only memory (EEPROM) according to an embodiment of the present invention.
Figure 2:
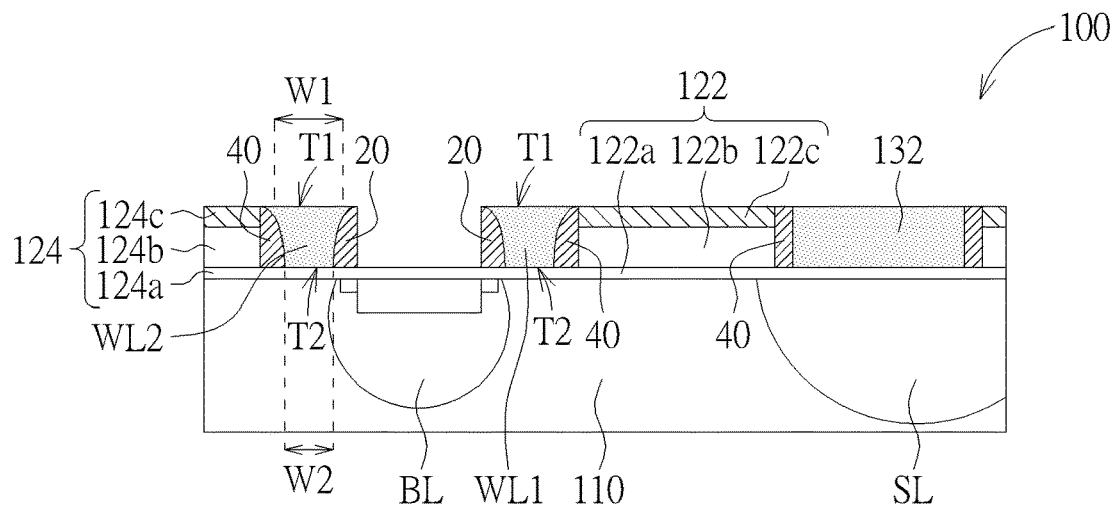
FIG. 2 schematically depicts a cross-sectional view of an array of electrically erasable programmable read only memory (EEPROM) according to an embodiment of the present invention.

FIG. 1 schematically depicts a top view of an array of electrically erasable programmable read only memory (EEPROM) according to an embodiment of the present invention. FIG. 2 schematically depicts a cross-sectional view of an array of electrically erasable programmable read only memory (EEPROM) according to an embodiment of the present invention. FIG. 2 is a cross-sectional view of FIG. 1 along line AA'. Please refer to FIG. 1 and FIG. 2, the array of electrically erasable programmable read only memory (EEPROM) in this embodiment is arranged regularly and repeatedly, so only one part is described.

Please refer to FIGS. 1-2, a substrate 110 is provided, wherein the substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. In this embodiment, only the substrate 110 of an electrically erasable programmable read only memory (EEPROM) area is depicted.

Figure 9:
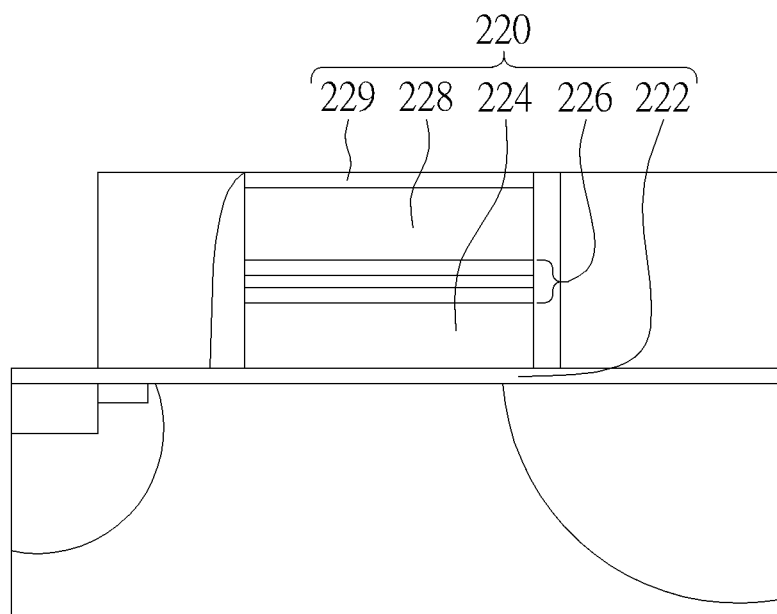
FIG. 9 schematically depicts a cross-sectional view of an array of electrically erasable programmable read only memory (EEPROM) according to another embodiment of the present invention.

A first row of floating gate 122 and a second row of floating gate 124 are disposed on the substrate 110 along a first direction x. In this embodiment, the first row of floating gate 122 and the second row of floating gate 124 are constituted by several island parts. The first row of floating gate 122 and the second row of floating gate 124 include stacked structures respectively. In this case, the first row of floating gate 122 includes a dielectric layer 122a, a floating gate layer 122b and a hard mask 122c stacked from bottom to top, and the second row of floating gate 124 includes a dielectric layer 124a, a floating gate layer 124b and a hard mask 124c stacked from bottom to top. The dielectric layer 122a and the dielectric layer 124a may be oxide layers, the floating gate layer 122b and the floating gate layer 124b may be polysilicon layers, and the hard mask 122c and the hard mask 124c may be nitride layers, but it is not limited thereto. In another embodiment, the stacked structures of the first row of floating gate 122 and the second row of floating gate 124 can be replaced by gates. As shown in FIG. 9, a gate 220 includes a dielectric layer 222, a bottom floating gate layer 224, an oxide/nitride/oxide (ONO) layer 226, a control gate layer 228 and a hard mask 229 stacked from bottom to top, wherein the dielectric layer 222 is an oxide layer, the bottom floating gate layer 224 is a polysilicon layer, the oxide/nitride/oxide (ONO) layer 226 is an oxide layer, a nitride layer and an oxide layer stacked from bottom to top, the control gate layer 228 is a polysilicon layer, and the hard mask 229 is a nitride layer, but it is not limited thereto.

Please refer to FIGS. 1-2, spacers 20 are disposed between and parallel to the first row of floating gate 122 and the second row of floating gate 124. First spacers 40 are disposed on sidewalls of the first row of floating gate 122 and the second row of floating gate 124. A first row of word line WL1 is sandwiched by one of the spacers 20 and the adjacent first row of floating gate 122, and a second row of word line WL2 is sandwiched by the other one of the spacers 20 and the adjacent second row of floating gate 124. The spacers 20 and the first spacers 40 sandwich the first row of word line WL1 and the second row of word line WL2, so the first row of word line WL1 and the second row of word line WL2 both have cross-sectional views broaden from bottom to top, wherein widths W1 of top surfaces T1 of the first row of word line WL1 and the second row of word line WL2 are larger than widths W2 of bottom surfaces T2 of the first row of word line WL1 and the second row of word line WL2. Since the first row of word line WL1 and the second row of word line WL2 are formed self-alignedly using the spacers 20 and the first spacers 40, the non-uniformity of the width W1 of the first row of word line WL1 and the width W2 of the second row of word line WL2 caused by the shiftings while patterning can be avoided.

A first row of erase gate 132 is disposed right next to the first row of floating gate 122 opposite to the first row of word line WL1, and a second row of erase gate 134 is disposed right next to the second row of erase gate 134 opposite to the second row of word line WL2. Source lines SL are located in the substrate 110 along the first direction x and right below the first row of erase gate 132 and the second row of erase gate 134. Bit line contacts BLC are disposed between the two spacers 20. Bit lines BL are disposed in the substrate 110 along a second direction y, wherein the second direction y is orthogonal to the first direction x. Each of the bit line contacts BLC contacts the corresponding bit line BL directly.

Figure 3:
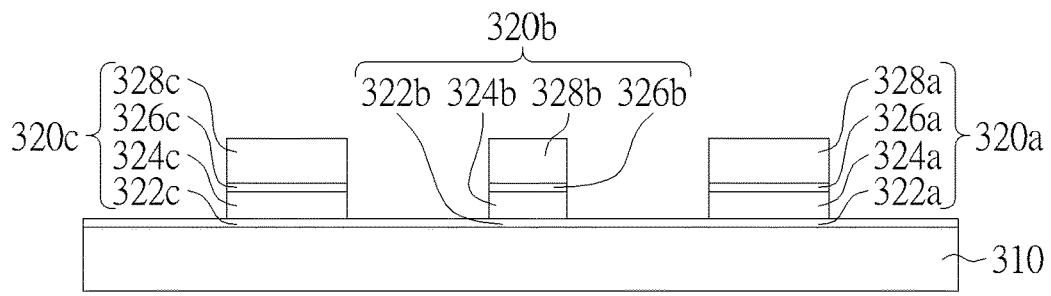
FIG. 3 schematically depicts a cross-sectional view of a method of forming an array of electrically erasable programmable read only memory (EEPROM) according to an embodiment of the present invention.

A method of forming an array of electrically erasable programmable read only memory (EEPROM) 100 is presented. FIGS. 3-8 schematically depict cross-sectional views of a method of forming an array of electrically erasable programmable read only memory (EEPROM) according to an embodiment of the present invention. As shown in FIG. 3, a first floating gate 320a, a dummy floating gate 320b and a second floating gate 320c are formed on a substrate 310. In this embodiment, a stacked structure of FIG. 9 is applied, but the stacked structure can be replaced by a stacked structure of FIG. 2, so that a stacked structure including a first floating gate 320a, a dummy floating gate 320b and a second floating gate 320c is provided. The first floating gate 320a includes a dielectric layer 322a, a bottom floating gate layer 324a, an oxide/nitride/oxide (ONO) layer 326a, a control gate layer 328a and a hard mask (not shown) stacked from bottom to top. The dummy floating gate 320b includes a dielectric layer 322b, a bottom floating gate layer 324b, an oxide/nitride/oxide (ONO) layer 326b, a control gate layer 328b and a hard mask (not shown) stacked from bottom to top. The second floating gate 320c includes a dielectric layer 322c, a bottom floating gate layer 324c, an oxide/nitride/oxide (ONO) layer 326c, a control gate layer 328c and a hard mask (not shown) stacked from bottom to top. In this embodiment, methods of forming the first floating gate 320a, the dummy floating gate 320b and the second floating gate 320c may include depositing and patterning gate layers such as a dielectric layer, a bottom floating gate layer, an oxide/nitride/oxide (ONO) layer, a control gate layer and a hard mask, to form the first floating gate 320a, the dummy floating gate 320b and the second floating gate 320c, but it is not limited thereto.

Figure 4:
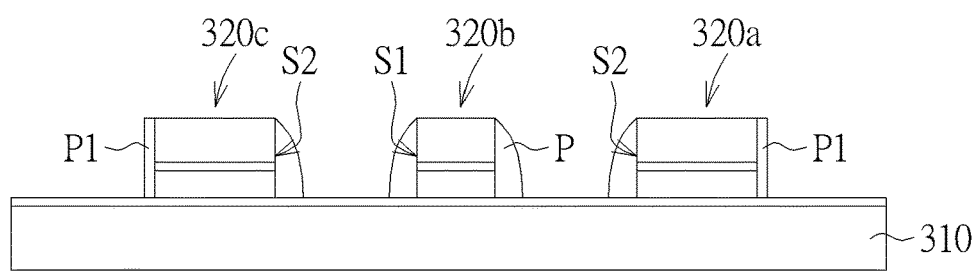
FIG. 4 schematically depicts a cross-sectional view of a method of forming an array of electrically erasable programmable read only memory (EEPROM) according to an embodiment of the present invention.

As shown in FIG. 4, spacers P are formed on sidewalls S1 of the dummy floating gate 320b, and first spacers P1 are formed on sidewalls S2 of the first floating gate 320a and the second floating gate 320c. The spacers P and the first spacers P1 may include nitride spacers or oxide spacers etc. Thicknesses of the formed spacers P and the formed first spacers P1 depend on the density of these stacked structures.

Figure 5:
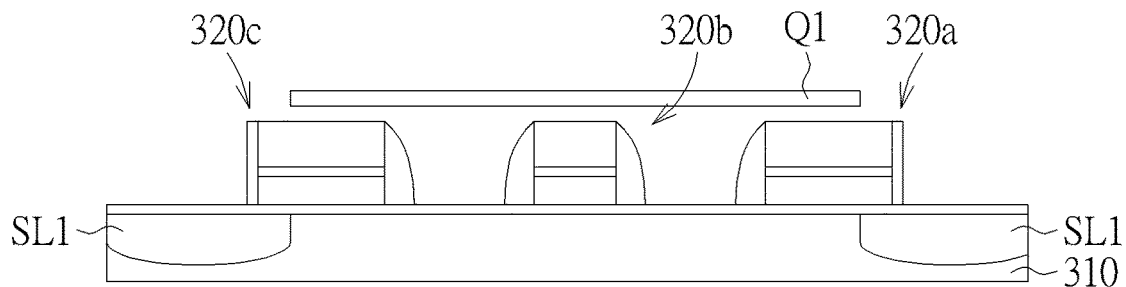
FIG. 5 schematically depicts a cross-sectional view of a method of forming an array of electrically erasable programmable read only memory (EEPROM) according to an embodiment of the present invention.

As shown in FIG. 5, source lines SL1 are located in the substrate 110 beside the first floating gate 320a opposite to the dummy floating gate 320b, and in the substrate 110 beside the second floating gate 320c opposite to the dummy floating gate 320b. A photoresist Q1 may be formed to cover parts except for areas for forming the source lines SL1, the source lines SL1 are formed by implant processes, and then the photoresist Q1 is removed.

Figure 6:
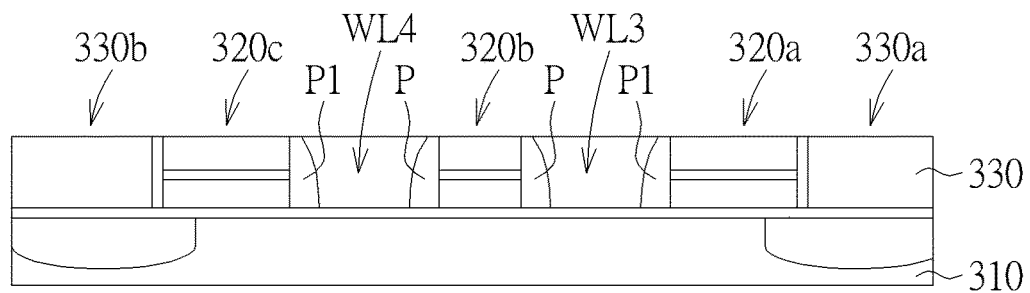
FIG. 6 schematically depicts a cross-sectional view of a method of forming an array of electrically erasable programmable read only memory (EEPROM) according to an embodiment of the present invention.

As shown in FIG. 6, an electrode layer 330 fills in space between the first floating gate 320a, the dummy floating gate 320b and the second floating gate 320c, wherein a part of the electrode layer 330 between one of the spacers P and the adjacent first floating gate 320a serves as a first word line WL3, and a part of the electrode layer 330 between the other one of the spacers P and the adjacent second floating gate 320c serves as a second word line WL4. A part of the electrode layer 330 right next to the first floating gate 320a opposite to the first word line WL3 serves as a first erase gate 330a, and a part of the electrode layer 330 right next to the second floating gate 320c opposite to the second word line WL4 serves as a second erase gate 330b.

Methods of filling the electrode layer 330 in space between the first floating gate 320a, the dummy floating gate 320b and the second floating gate 320c may include depositing and planarizing the electrode layer 330 on the substrate 310, and then etching back the electrode layer 330, to ensure the first floating gate 320a, the dummy floating gate 320b and the second floating gate 320c being exposed. The spacers P and the first spacers P1 are formed in the present invention, and the first word line WL3 and the second word line WL4 are self-aligned between the spacers P and the first spacers P1, so that the non-uniformity of the widths of the first word line WL3 and the second word line WL4 caused by the shiftings while patterning can be avoided.

Figure 7:
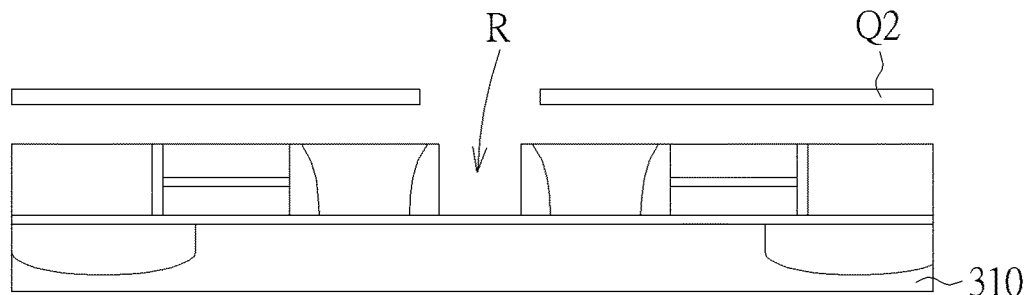
FIG. 7 schematically depicts a cross-sectional view of a method of forming an array of electrically erasable programmable read only memory (EEPROM) according to an embodiment of the present invention.

Then, the dummy floating gate 320b is removed to form a recess R, as shown in FIG. 7. For example, a photoresist Q2 is formed to cover areas except for the dummy floating gate 320b, and then the dummy floating gate 320b is removed.

Figure 8:
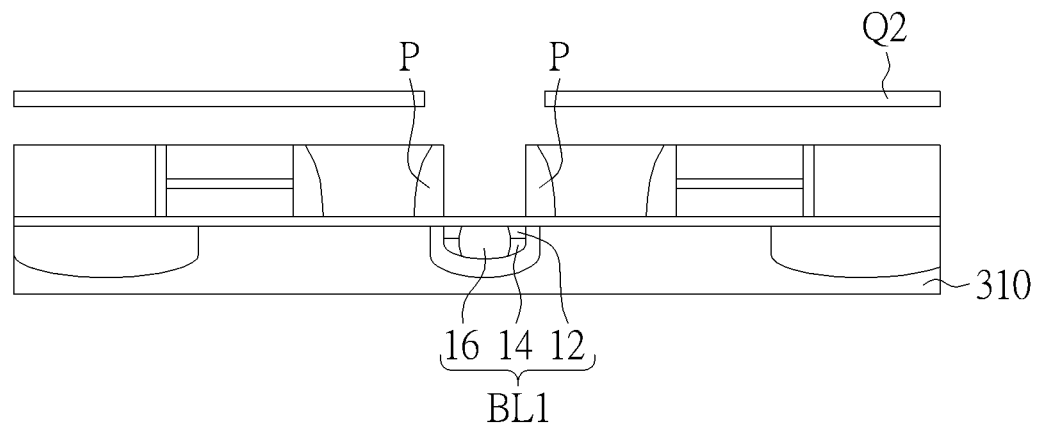
FIG. 8 schematically depicts a cross-sectional view of a method of forming an array of electrically erasable programmable read only memory (EEPROM) according to an embodiment of the present invention.

As shown in FIG. 8, a bit line BL1 is formed in the substrate 310 between the spacers P, wherein the bit line BL1 may include a lightly doped region 12, a halo implantation region 14 and a source/drain 16. The lightly doped region 12, the halo implantation region 14 and the source/drain 16 may be formed by implantation processes. Then, the photoresist Q2 is removed. The bit line contacts BLC of FIG. 1 may be formed on the bit lines BL1.

To summarize, the present invention provides an array of electrically erasable programmable read only memory (EEPROM) and forming method thereof, which forms a first floating gate, a dummy floating gate and a second floating gate on a substrate; forms spacers on sidewalls of the dummy floating gate, and forms first spacers on sidewalls of the first floating gate and the second floating gate; fills an electrode layer in space between the first floating gate, the dummy floating gate and the second floating gate. By doing this, a part of the electrode layer between one of the spacers and the adjacent first floating gate serves as a first word line, and a part of the electrode layer between the other one of the spacers and the adjacent second floating gate serves as a second word line. A part of the electrode layer right next to the first floating gate opposite to the first word line serves as a first erase gate, and a part of the electrode layer right next to the second floating gate opposite to the second word line serves as a second erase gate. By forming word lines between spacers by self-aligning, the non-uniformity of the widths of the word lines caused by the shiftings while patterning can be avoided. After the dummy floating gate is removed, the bit lines and the bit line contacts may be formed between the spacers.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An array of programmable memory, comprising:
   a first row of floating gate and a second row of floating gate disposed on a substrate along a first direction;
   two spacers disposed between and parallel to the first row of floating gate and the second row of floating gate;
   a first row of word line sandwiched by one of the spacers and the adjacent first row of floating gate, and a second row of word line sandwiched by the other one of the spacers and the adjacent second row of floating gate; and
   two first spacers disposed on the substrate and parallel to the first row of floating gate and the second row of floating gate, wherein one of the first spacer is disposed between the first row of word line and the first row of floating gate, and another first spacer is disposed between the second row of word line and the second row of floating gate, wherein each spacer has substantially the same shape as each first spacer.

2. The array of programmable memory according to claim 1, further comprising:
   a first row of erase gate disposed right next to the first row of floating gate opposite to the first row of word line, and a second row of erase gate disposed right next to the second row of floating gate opposite to the second row of word line.

3. The array of programmable memory according to claim 2, further comprising:
   source lines located in the substrate along the first direction and right below the first row of erase gate and the second row of erase gate.

4. The array of programmable memory according to claim 1, wherein the first row of floating gate and the second row of floating gate are constituted by several island parts.

5. The array of programmable memory according to claim 1, further comprising:
   bit line contacts disposed between the two spacers.

6. The array of programmable memory according to claim 5, further comprising:
   bit lines disposed in the substrate along a second direction orthogonal to the first direction, wherein each of the bit line contacts directly contacts the corresponding bit line.

7. A programmable memory, comprising:
   a first floating gate and a second floating gate disposed on a substrate;
   two spacers disposed between the first floating gate and the second floating gate; and
   a first word line sandwiched by one of the spacers and the adjacent first floating gate, and a second word line sandwiched by the other one of the spacers and the adjacent second floating gate; and
   two first spacers disposed on the substrate, wherein one of the first spacer is disposed between the first word line and the first floating gate, and another first spacer is disposed between the second word line and the second floating gate, wherein each spacer has substantially the same shape as each first spacer.

8. The programmable memory according to claim 7, further comprising:
   a first erase gate disposed right next to the first floating gate opposite to the first word line, and a second erase gate disposed right next to the second floating gate opposite to the second word line.

9. The programmable memory according to claim 8, further comprising:
   source lines located right below the first erase gate and the second erase gate.

10. The programmable memory according to claim 7, further comprising:
    bit line contacts disposed between the two spacers.

11. The programmable memory according to claim 10, further comprising:
    bit lines disposed right below the bit line contacts.

12. The programmable memory according to claim 7, wherein the first floating gate and the second floating gate comprise stacked structures respectively.

13. The programmable memory according to claim 12, wherein each of the stacked structures comprises a dielectric layer, a floating gate layer and a hard mask stacked from bottom to top.

14. The programmable memory according to claim 12, wherein each of the stacked structures comprises a dielectric layer, a bottom floating gate layer, an oxide/nitride/oxide (ONO) layer, a control gate layer and a hard mask stacked from bottom to top.

* * * * *